United States Patent [19]
Hundt et al.

[11] Patent Number: 5,196,374
[45] Date of Patent: Mar. 23, 1993

[54] INTEGRATED CIRCUIT PACKAGE WITH MOLDED CELL

[75] Inventors: Michael J. Hundt, Double Oak; Krishnan Kelappan, Carrollton, both of Tex.

[73] Assignee: SGS-Thomson Microelectronics, Inc., Carrollton, Tex.

[21] Appl. No.: 801,254

[22] Filed: Dec. 3, 1991

Related U.S. Application Data

[60] Division of Ser. No. 617,500, Nov. 21, 1990, Pat. No. 5,124,782, which is a continuation-in-part of Ser. No. 470,939, Jan. 26, 1990, abandoned.

[51] Int. Cl.$^5$ .............................................. H01L 21/60
[52] U.S. Cl. .................... 437/209; 437/214; 437/220; 429/123; 439/68; 439/70; 365/228; 365/229
[58] Field of Search ............ 437/209, 214, 220; 365/228, 229; 429/123; 439/68, 69, 70, 71, 72, 73; 357/70, 72

[56] References Cited

U.S. PATENT DOCUMENTS

| | | | |
|---|---|---|---|
| 4,380,357 | 4/1983 | Evans et al. ........................ | 439/68 |
| 4,645,943 | 2/1987 | Smith, Jr. et al. .................. | 429/123 |
| 4,864,373 | 9/1989 | Myashita ............................ | 357/41 |
| 4,998,888 | 3/1991 | Link et al. .......................... | 439/73 |
| 5,008,776 | 4/1991 | Queyssac ............................ | 357/75 |
| 5,055,704 | 10/1991 | Link et al. .......................... | 357/75 |

FOREIGN PATENT DOCUMENTS

| | | |
|---|---|---|
| 0171089 | 2/1986 | European Pat. Off. . |
| 0438905 | 7/1991 | European Pat. Off. . |
| 61-164257 | 1/1985 | Japan . |

OTHER PUBLICATIONS

"Designer's Dream Machine", Electronics, vol. 60, No. 5, pp. 53-57, Mar. 1987.

Primary Examiner—Brian E. Hearn
Assistant Examiner—Kevin M. Picardat
Attorney, Agent, or Firm—Dennis T. Griggs; Lisa K. Jorgenson; Richard K. Robinson

[57] ABSTRACT

An integrated circuit package encapsulates a volatile memory chip and a backup battery for preserving data in the event of loss of main power supply. The package includes a lead frame assembly encapsulated within a body of non-conductive material, with the memory chip being mounted onto a base plate on one side of the lead frame. The battery is supported in offset relation by axial power leads on the opposite side of the lead frame. The integrated circuit chip, the battery, the lead frame assembly and the gold interconnect wires are completely encapsulated within the molded package body.

3 Claims, 2 Drawing Sheets

INTEGRATED CIRCUIT PACKAGE WITH MOLDED CELL

CROSS REFERENCE TO RELATED APPLICATION

This is a divisional of application Ser No. 617,500 filed Nov. 21, 1990, now U.S. Pat. No. 5,124,782; which is a continuation-in-part of Ser. No. 470,939 filed Jan. 26, 1990, abandoned.

FIELD OF THE INVENTION

This invention relates generally to packaging for semiconductor devices, and in particular to an integrated circuit package for encapsulating a semiconductor integrated circuit such as a memory chip and a backup battery for preserving memory data in the event of loss of main power supply.

BACKGROUND OF THE INVENTION

Conventional electronic circuit packages for semiconductor integrated circuit chips are adapted to enclose and seal the chip devices, while also providing heat dissipation, structural support, electrical attachment of device leads to external pin connectors, and electrical interconnection with other devices in the package. Such packages may be formed of one or more layers of a non-conductive material, with the semiconductor chip embedded within one of the layers. Flexible metal leads are extended from an interconnect region surrounding the chip to edge mounted connector pins for connecting the device input/output terminals to a printed circuit board socket in a host electronic circuit.

An important integrated circuit product which is implemented on an IC chip encapsulated within an integrated circuit package includes a volatile semiconductor memory such as the static random access memory (SRAM) which is characterized by low power consumption and high memory cell density. The generation of valid logic signals and the retention of data in such integrated memory circuits having volatile memory cells depend in part on maintenance of power supply voltages within specified limits. In conventional integrated circuit memory devices, internal circuits sense the external source voltage being applied to determine if it is sufficient for reliable operation. In response to a low voltage condition, control signals are generated which cause active chips to be de-selected and maintained in standby condition. This is usually carried out by means of true and complement chip select signals, CS and CS, respectively, which inhibit read/write operations until the low voltage condition has been corrected.

During the period that a memory chip is in the unselected condition it is necessary to maintain the charge levels of the storage capacitors in the volatile memory cells so that stored data will be retained. Otherwise, the information stored in the memory cells, including programs and data, will be lost when main power is removed. Although the loss of power does not result in memory circuit damage, the loss of stored information requires that the memory be reloaded with programs and data before processing can be reestablished.

DESCRIPTION OF THE PRIOR ART

It has been proposed to solve the data loss problem by using an additional pin terminal on memory semiconductor circuits and that the additional terminal will be supplied with backup power from a remote source to maintain the data in the memory cells. However, there are now established standardized pin patterns for most integrated circuit memories; consequently, the addition of another pin dedicated to a remote backup power supply would not be compatible with standard pin patterns, and would require a substantial redesign of existing circuits.

Accordingly, there exists a need for a semiconductor memory package for encapsulating a memory chip and a backup battery wherein the socket area and standard pin configuration are not affected, and stored data are retained despite a loss of the main power supply.

A substantial portion of the cost and size of a packaged chip is attributable to package fabrication, and two important design criteria in addition to providing a reliable electrical connection are cost effectiveness and space efficiency. A need thus exists for an improved device package for safely supporting an integrated circuit chip and a backup battery wherein the package is provided with pin connectors formed therein for plug-in compatibility with standard printed circuit board sockets, and the packaging space required for supporting the backup battery is minimized.

Some packages for integrated circuit memory devices include a battery molded within one half section of a two-part package. In that construction, a chip is loaded onto the base plate of a lead frame and wires are bonded between I/0 pads and respective internal leads. The mold is heated, and molding resin is then injected into the heated mold cavity. Consequently, the lead frame and IC chip are encapsulated by the resin within one molded half section. A small battery and other discrete components, for example a crystal, are mounted within a second half section. The second selected half section includes connector pins accurately positioned for engaging finger leads in the lead frame of the first molded half section. The dual section arrangement has served well for many product applications. However, the additional height imposed by the second half section produces a package which exceeds the maximum height limit established for critical space product applications.

Accordingly, a need thus exists for an improved device package in which a semiconductor circuit device, a lead frame assembly and a backup battery are encapsulated within a single molded body of non-conductive material, wherein the packaging height dimension is less than the height of conventional two-part device packages which include a backup battery.

SUMMARY OF THE INVENTION

The present invention provides an improved package for encapsulating an integrated circuit device, including a backup battery, and it overcomes the foregoing backup battery limitations by mounting the integrated circuit device onto a base plate on one side of a finger lead assembly, and by mounting an axial lead battery on the opposite side of the finger lead of a lead frame assembly. In this arrangement, the battery has positive and negative axial leads and which support the body of the battery in offset relation above the finger lead frame assembly. The integrated circuit device substrate is bonded to the underside of the base plate by a layer of adhesive. The backup battery, integrated circuit device and finger leads are totally enclosed within the molded body of the package, without altering the socket area or the pin configuration. Although the package height is increased to totally encapsulate the backup battery, the package height does not exceed the maximum limit established for critical space product applications.

Operational features and advantages of the present invention will be appreciated by those skilled in the art upon reading the detailed description which follows with reference to the attached drawings, wherein:

DETAILED DESCRIPTION OF THE PREFERRED EMBODIMENT

Figure 1:
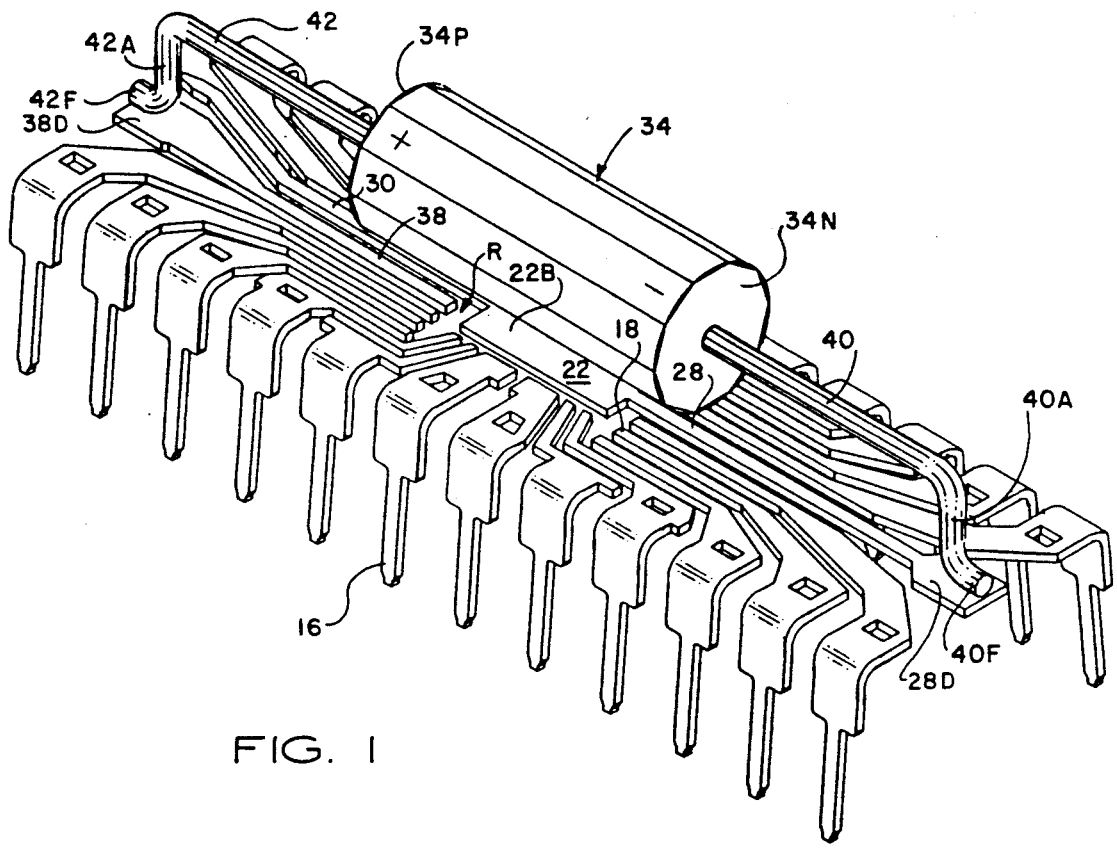
FIG. 1 is a perspective view of a lead frame assembly having an integrated circuit chip mounted onto the underside surface of a base plate and an axial lead battery supported above the lead frame assembly.

In the description which follows, like parts are indicated throughout the specification and drawings with the same reference numerals, respectively. By way of example, the invention is described in combination with a static random access memory (SRAM) which is implemented by monolithic CMOS/LSI techniques on an N-type silicon semiconductor chip. It will be appreciated, however, that the packaging assembly of the invention may be used to encapsulate and provide backup battery power for discrete as well as other integrated devices, and has particular utility for volatile memory integrated circuits having multiple input/output nodes. Accordingly, it should be understood that the invention in its broadest aspects may be incorporated in any moldable package which houses one or more circuit devices requiring backup power, including but not limited to discrete, micro-discrete and integrated circuit components, and hybrid combinations of discrete and integrated devices.

Figure 2:
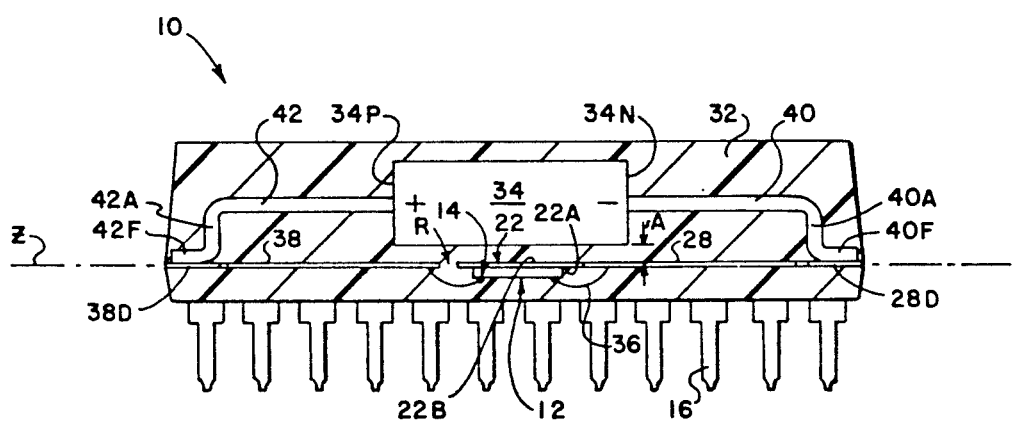
FIG. 2 is a side sectional view of the semiconductor circuit chip battery and lead frame assembly of FIG. 1 in a unitary molded package; and, FIG. 3 is a bottom plan view, partially broken away, of the integrated circuit chip, backup battery and lead frame assembly of FIG. 1.

Referring now to FIG. 1 and FIG. 2, there is shown an exemplary semiconductor chip package 10 incorporating the present invention. The package 10 supports and encapsulates an integrated circuit chip 12 having input/output nodes 14. The IC chip 12 may be, for example a 2K×8 static random access memory (SRAM) circuit which is characterized by low power consumption, high memory cell density and which is implemented on an N-type silicon substrate by complementary metal oxide semiconductor (CMOS) technology.

The exemplary package 10 has a conventional dual-in-line pin configuration including twenty-four external connector pins arranged in two parallel rows with 600 mil spacing along the longitudinal edges of the package. The input/output nodes 14 of the integrated circuit chip 12 are electrically connected to selected connector pins 16 by conductive finger leads 18 of a lead frame assembly 20 as shown in FIG. 3.

The inner lead fingers 18 are radially spaced with respect to a central base plate 22 and are integrally formed with the connector pins 16. Linking segments 20L of the lead frame assembly 20 are ultimately trimmed away during manufacture, whereby each inner lead 18 is electrically connected to a single connector pin 16. Transport side rail strips 24, 26 on the outer perimeter of the lead frame 20 are also cut away during trim and form operations in the last stages of manufacture, after molding has taken place.

The inner tips of the conductive fingers 18 are radially spaced about the base plate 22 in an interconnect region R. The inner tips of the conductive fingers 18 are relatively narrow, and the fingers expand substantially as they radiate outwardly from the base plate 22. The lead frame assembly 20 includes base plate finger leads 28, 30 which extend from opposite edges of the base plate 22 in alignment with the longitudinal axis Z of the integrated circuit package 10.

Figure 3:
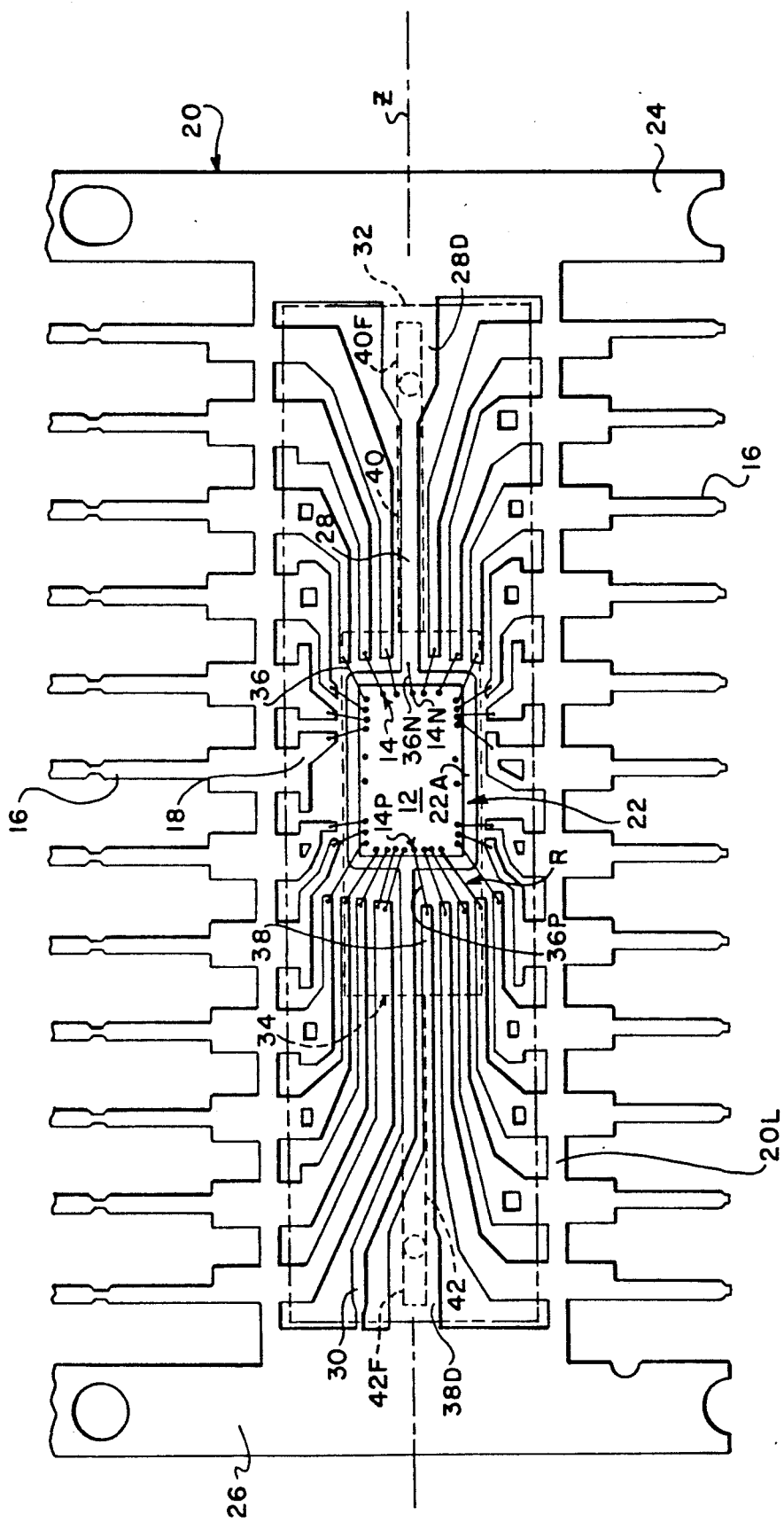

The external connector pins 16 and inner finger leads 18 are initially coplanar during molding, as shown in FIG. 3. After molding, the connector pin portions 16 are bent through a 90 degree angle along the longitudinal side surfaces of the package during the trim and form operation. However, the inner finger leads 18 and base plate 22 remain coplanar as shown in FIG. 1 and FIG. 2.

The semiconductor chip package 10 provides a standard external pin pattern for electrically connecting the input/output nodes 14 of the semiconductor chip 12 to a socket on a printed circuit board of a host electronic system or on some other semiconductor package. The chip package 10 includes a molded body 32 of non-conductive material, for example a polymer such as polyetherimide or epoxy resin. In this arrangement, the finger lead assembly 20, the semiconductor chip 12 and a backup battery 34 are embedded and encapsulated within the molded body 30.

Preferably, the backup battery 34 is an axial lead cell which is hermetically sealed so that its electrolyte will not evaporate when it is exposed to the elevated temperature conditions of the transfer molding procedure. Additionally, it is preferred that the battery 34 have a non-linear internal resistance which increases rapidly to a high current limiting value in response to short circuit current flow. This is desirable because the backup battery 34 will be shorted by the lead frame during assembly, and during transfer molding, until the lead frame has been trimmed. For some applications, it is desirable that the backup battery 34, in addition to being hermetically sealed and having short circuit protection, is also rechargeable so that its charge level can be restored to its rated value after assembly has been completed.

In one exemplary embodiment, the battery 32 is a 2.8 volt DC cell having a substantially cylindrical body of 0.1575 inch diameter and a body length of about 0.42 inch. It is essential that the battery 34 be rated for high temperature duty, since it will be exposed to high temperatures during wire bonding and transfer molding. Otherwise, the electrolyte within the battery will evaporate and the battery charge will be destroyed. An example of a suitable axial lead battery 34 is a lithium-iodine cell which can be obtained from Catalyst Research Company of Baltimore, Md., under Model No. B35. That cell is rated at 2.8 volt DC and 35 Mah, has a 70 degree C shelf life of 10 years, and can survive elevated temperature conditions of 225 degrees C for three to five minutes without failure, which is more than adequate for the transfer molding procedure contemplated herein. The battery 34 has a positive terminal 34P and a negative terminal 34N formed on opposite ends of the battery body.

The semiconductor chip 12 is bonded to the underside surface 22A of the base plate 22 by a conductive deposit of silver-filled epoxy adhesive such as Ablebond TM 84-1. The input/output nodes 14 are electrically connected to selected conductive fingers 18 by fine gold wires 36 having a diameter of 1.3 mil. Bonding of the gold wires 36 to the conductive fingers 18 and I/0 nodes 14 is preferably by the conventional thermosonic ball bonding technique.

The negative and positive terminals 34N, 34P of the backup battery 34 are electrically connected to finger leads 28, 38, respectively, prior to encapsulation, preferably by resistance welding or by soldering. The finger leads 28, 38 serve as negative and positive interconnect leads for conducting current from the backup battery 34 to the interconnect region R. As can be seen in FIG. 1, the battery 34 has negative and positive axial leads 40, 42 which support the body of the battery 34 in vertical offset relation above the lead frame assembly 20. Each axial lead 40, 42 is terminated by a freestanding, compliant gull-wing lead 40A, 42A, respectively, having bonding feet 40F, 42F, respectively. The interconnect leads 28, 38 have distal end portions 28D, 38D, respectively, which serve as bonding pads for electrical attachment to the battery leads 40, 42, respectively. The dimensions of the gull-wing leads are selected to provide a battery stand-off clearance A of 0.030 inch above the base plate 22, and a total axial length (including axial lead) of about 1.25 inch.

After the device 12 has been attached to the base plate mounting surface 22A, the ends of the fine gold wires 36 are then connected between the chip I/0 nodes 14 and the respective finger leads 18. A gold wire 36P is bonded between the positive interconnect lead 38 and the positive backup voltage node 14P of Chip 12. The negative backup voltage node 14N is electrically connected to the negative interconnect lead 28 by a gold wire 36N.

The lead frame assembly 20 is then placed in a multicavity split mold. The mold cavity is closed in a transfer molding machine and a non-conductive encapsulant material such as polyphenolene sulfide is injected in fine pellet form from a nozzle. The pressure at which this injection takes place is closely controlled to prevent damage to the gold wire bonds. Under the appropriate pressure and temperature, the pellets melt and flow into channels within the mold and fill the cavities around the lead frame assembly 20, thereby completely encapsulating the lead frame 20, the backup battery 34, IC chip 12 and gold wires 36. The resin is cured while still in the mold by the applied heat and pressure. Further curing takes place in an oven.

As a result of the foregoing transfer mold procedure, the package 10 is produced in the form of an elongate, generally rectangular molded body 32 of non-conductive material. After removal from the mold, the linking segments 20L between adjacent pins 16 in the lead frame assembly 20 are cut to separate and electrically isolate the pins and conductive finger leads from one another. Additionally, the transport side rails 24, 26 are also cut and separated from the molded assembly.

The lead frame 20 material preferably comprises a conventional metal alloy, such as a tin-plated nickel or iron alloy or, alternatively, a tin-plated copper alloy such as CDA 194. It will be appreciated that during assembly, the connector pins and inner conductive leads are structurally interconnected by the linking segments 20L and by the side transport side rails 24, 26, preferably stamped from a continuous metal strip. The connecting sections remain attached to the connector pins for handling purposes only and are severed during trim and form operations in the last stages of manufacture, after molding has taken place.

It will be understood that a selected one of the external pins 16 is adapted for connection to a primary power supply node which provides a voltage $V_{cc}$ which is typically at +5.0 volts DC. Similarly, another external connector pin is adapted for connection to a ground node of a host electronic system for providing a ground-reference GND. Other pins are dedicated for true and complement chip select signals, CS and CS, a signal CLK for synchronously clocking data to and from the monolithic integrated circuit 12, as well as various other I/0 signals which are produced by the host electronic circuit. A comparator and switching circuit (not illustrated) compares the voltage $V_{cc}$ from the primary power supply of the host electronic circuit with the voltage of the backup battery 34 and automatically connects the highest detected voltage to power the integrated circuit 12.

Because of the vertical offset A, the backup battery 34 is vertically spaced from the top surface of the base plate 22 and is centered longitudinally within the package 10. By virtue of this arrangement, the finger lead assembly, the backup battery, chip and gold wires are completely encapsulated within the compact molded body 32.

Although the invention has been described with reference to a preferred embodiment, and with reference to a package which encapsulates and provides backup battery power for an integrated circuit device, the foregoing description is not intended to be construed in a limiting sense. Various modifications of the disclosed premolded battery package as well as alternative applications thereof will be suggested to persons skilled in the art by the foregoing specification and illustrations. It is therefore contemplated that the appended claims will cover any such modifications or embodiments that fall within the true scope of the invention.

What is claimed is:

1. A method for packaging an electronic circuit device of the type having positive and negative power nodes and a battery for providing electrical power to the electronic circuit device comprising the steps:
   arranging the conductive finger leads of a coplanar finger lead assembly in spaced relation about an interconnect region with one of the conductive finger leads defining a first polarity power lead and having a base plate disposed within said interconnect region, and one of the conductive finger leads defining a second polarity power lead;
   mounting said electronic circuit device on the base plate on one side of the coplanar finger lead assembly;
   connecting the positive and negative power leads of a battery to the first and second polarity power finger leads on one side of the coplanar finger lead assembly;
   connecting the positive and negative power nodes of said electronic circuit device to the first and second power finger leads by first and second wire conductors, respectively; and,
   encapsulating the electronic circuit device, battery, battery power leads, finger leads and wire conductors within a body of non-conductive material.

2. A method for packaging an electronic circuit device and battery as defined in claim 1, wherein the electronic circuit device is an integrated circuit implemented on a semiconductor substrate, said integrated circuit having a plurality of input/output nodes, including the steps of mounting the semiconductor substrate on the base plate, and connecting the input/output nodes to the conductive finger leads by wire conductors.

3. A method for packaging an electronic circuit device of the type having first and second power input nodes and a battery for providing electrical power to said electronic circuit device comprising the steps:

connecting the positive and negative power leads of an axial lead battery to first and second finger leads of a coplanar finger lead assembly with the axial lead battery being supported by its power leads in offset relation to one side of the coplanar finger lead assembly;

mounting the electronic circuit device on one of the finger leads;

connecting the first and second device power input nodes to the first and second finger leads by first and second wire conductors, respectively; and, encapsulating the electronic circuit device, battery, finger leads and wire conductors within a body of non-conductive material.

* * * * *